United States Patent
Park

(10) Patent No.: US 12,424,948 B2
(45) Date of Patent: Sep. 23, 2025

(54) DEVICE AND METHOD OF CONTROLLING THE SAME

(71) Applicant: HL MANDO CORPORATION, Gyeonggi-do (KR)

(72) Inventor: Yunwook Park, Gyeonggi-do (KR)

(73) Assignee: HL MANDO CORPORATION, Gyeonggi-do (KR)

( * ) Notice: Subject to any disclaimer, the term of this patent is extended or adjusted under 35 U.S.C. 154(b) by 282 days.

(21) Appl. No.: 18/219,200

(22) Filed: Jul. 7, 2023

(65) Prior Publication Data

US 2024/0339938 A1 Oct. 10, 2024

(30) Foreign Application Priority Data

Apr. 4, 2023 (KR) .......................... 10-2023-0043965

(51) Int. Cl.
| | | |
|---|---|---|
| H02M 7/53 | (2006.01) | |
| H02M 7/537 | (2006.01) | |
| H02P 21/22 | (2016.01) | |
| H02P 27/06 | (2006.01) | |
| H03K 17/14 | (2006.01) | |
| H03K 17/687 | (2006.01) | |

(52) U.S. Cl.
CPC ............ *H02M 7/537* (2013.01); *H02P 21/22* (2016.02); *H02P 27/06* (2013.01); *H03K 17/145* (2013.01); *H03K 17/687* (2013.01)

(58) Field of Classification Search
CPC .... H02M 7/537; H02M 1/0009; H02M 1/327; H02M 7/5387; H02P 21/22
See application file for complete search history.

(56) References Cited

U.S. PATENT DOCUMENTS

| | | | |
|---|---|---|---|
| 9,419,604 B2 * | 8/2016 | Fukuta | H03K 17/18 |
| 9,601,984 B2 * | 3/2017 | Hamanaka | H02M 3/1588 |
| 10,343,712 B2 * | 7/2019 | Kuroda | B62D 5/0496 |

FOREIGN PATENT DOCUMENTS

| | | |
|---|---|---|
| KR | 10-2014-0047758 | 4/2014 |
| KR | 10-2020-0003520 | 1/2020 |
| KR | 10-2101901 | 4/2020 |
| KR | 10-2020-0112096 | 10/2020 |

OTHER PUBLICATIONS

Office Action dated Nov. 25, 2024 for Korean Patent Application No. 10-2023-0043965 and its English translation provided by Applicant's foreign counsel.

\* cited by examiner

*Primary Examiner* — Adolf D Berhane
*Assistant Examiner* — Afework S Demisse
(74) *Attorney, Agent, or Firm* — WOMBLE BOND DICKINSON (US) LLP

(57) ABSTRACT

Disclosed herein is a device, and the device may include: an inverter including a plurality of power switching elements configured to supply a current to a motor; a current sensor configured to detect a current of each phase of the motor; a plurality of voltage detection circuits configured to detect voltages of the plurality of power switching elements; and a controller electrically connected to the plurality of voltage detection circuits. The controller determines a parasitic resistance of a turned-on power switching element based on a phase current and a voltage of the turned-on power switching element among the plurality of power switching elements, and estimates a junction temperature of the turned-on power switching element based on the parasitic resistance.

20 Claims, 4 Drawing Sheets

DEVICE AND METHOD OF CONTROLLING THE SAME

CROSS-REFERENCE TO RELATED APPLICATION

This application claims the benefit of Korean Patent Application No. 10-2023-0043965, filed on Apr. 4, 2023 in the Korean Intellectual Property Office, the disclosure of which is incorporated herein by reference.

BACKGROUND

1. Field

Embodiments of the present disclosure relate to a device for performing power conversion using a power switching element, which is a power semiconductor module, and a method of controlling the device.

2. Description of the Related Art

In line with the recent trend of the ever-growing eco-friendly electrification market, vehicles and personal mobilities are being electrified and released as products. Most of the electrified products include a power conversion device that performs power conversion using a power switching element.

A power conversion device is designed such that a plurality of power switching elements are connected in parallel and each of the power switching elements performs a uniform switching operation. When a junction temperature of one power switching element of the plurality of power switching elements exceeds a permissible temperature, the power switching element has a different switching timing from the other power switching elements so that an imbalance occurs where a current flowing through the power switching element is concentrated or does not flow smoothly. Thus, the power conversion device may be damaged or may fail.

A junction temperature of a power switching element is generally measured using a temperature sensor, but a temperature difference from the junction temperature occurs according to a location where the temperature sensor is attached, and there is a technical difficulty in measuring an actual junction temperature. That is, the junction temperature of the power switching element is difficult to measure since the junction temperature is a temperature inside an IC chip where the power switching element is sealed in resin. Accordingly, since the temperature sensor is attached around a heat source or on a case to measure an ambient temperature and estimate a junction temperature indirectly, the junction temperature is difficult to measure accurately and reliably.

SUMMARY

Therefore, it is an aspect of the present disclosure to provide a device capable of detecting a junction temperature of a power switching element more accurately and reliably by directly detecting the junction temperature and a controlling method thereof.

It is another aspect of the present disclosure to provide a device capable of reliably detecting a driving current by dualizing a tool for measuring the driving current and a controlling method thereof.

In accordance with one aspect of the present disclosure, a device includes: an inverter including a plurality of power switching elements configured to control a current supplied to a motor; a current sensor configured to detect a phase current of each phase of the motor; a plurality of voltage detection circuits configured to detect voltages of the plurality of power switching elements; and a controller configured to determine a parasitic resistance of a turned-on power switching element among the plurality of power switching elements based on the phase current and a voltage of the turned-on power switching element, and determine a junction temperature of the turned-on power switching element based on the parasitic resistance.

The plurality of voltage detection circuits may be provided to be connected to a plurality of low-side power switching elements among the plurality of power switching elements.

The plurality of low-side power switching elements may include metal oxide semiconductor field effect transistors (MOSFETs), and each of the plurality of voltage detection circuits may be provided to detect a voltage between a drain terminal and a source terminal of each of the MOSFETs.

The controller may include a memory in which junction temperatures for each parasitic resistance are stored.

The controller may estimate a junction temperature corresponding to the determined parasitic resistance according to the junction temperatures for each parasitic resistance stored in the memory.

When the junction temperature is higher than a preset temperature, the controller may reduce an output of the inverter.

The controller may reduce an output current of the inverter according to the junction temperature.

In accordance with another aspect of the present disclosure, a device includes: an inverter including a plurality of power switching elements configured to control a current supplied to a motor; a current sensor configured to detect a detected phase current of each phase of the motor; a plurality of voltage detection circuits configured to detect voltages of the plurality of power switching elements; and a controller configured to determine a determined phase current of a turned-on power switching element among the plurality of power switching elements based on a voltage of the turned-on power switching element and a parasitic resistance of the turned-on power switching element, and identify a phase current of the turned-on power switching element based on the detected phase current of the turned-on power switching element and the determined phase current of the turned-on power switching element.

The plurality of voltage detection circuits may be provided to be connected to a plurality of low-side power switching elements among the plurality of power switching elements.

The plurality of low-side power switching elements may include metal oxide semiconductor field effect transistors (MOSFETs), and each of the plurality of voltage detection circuits may be provided to detect a voltage between a drain terminal and a source terminal of each of the MOSFETs.

The controller may include a memory in which parasitic resistances of the plurality of power switching elements are stored.

The controller may determine the determined phase current of the turned-on power switching element based on the voltage of the turned-on power switching element and the parasitic resistance of the turned-on power switching element stored in the memory.

When a difference between the detected phase current and the determined phase current is greater than a predetermined permissible error, the controller may determine failure of the current sensor.

The controller may determine the determined phase current as the phase current of the turned-on power switching element.

When the difference between the detected phase current and the determined phase current is not greater than the predetermined permissible error, the controller may determine a normal operation of the current sensor.

In accordance with another aspect of the present disclosure, a method includes: detecting a current of a power switching element through a current sensor configured to detect a current of the power switching element when the power switching element is driven; detecting a voltage of the power switching element through a voltage detection circuit connected to both ends of the power switching element; determining a parasitic resistance of the power switching element based on the current and the voltage of the power switching element; and determining a junction temperature of the power switching element based on the parasitic resistance.

The determining of the junction temperature may include determining a junction temperature corresponding to the parasitic resistance using a lookup table in which junction temperatures for each parasitic resistance are recorded.

The method may further include comparing the junction temperature and a preset temperature, and reducing an output of the power conversion device based on the junction temperature being higher than the preset temperature.

The method may further include determining a current of the power switching element based on the voltage of the power switching element and the parasitic resistance of the power switching element, and determining a phase current of the power switching element based on the detected current of the power switching element and the determined current of the power switching element.

The determining of the phase current of the power switching element may include determining failure of the current sensor based on a difference between the detected current and the determined current being greater than a predetermined permissible error, and determining the determined current as the phase current of the power switching element in response to the failure of the current sensor.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
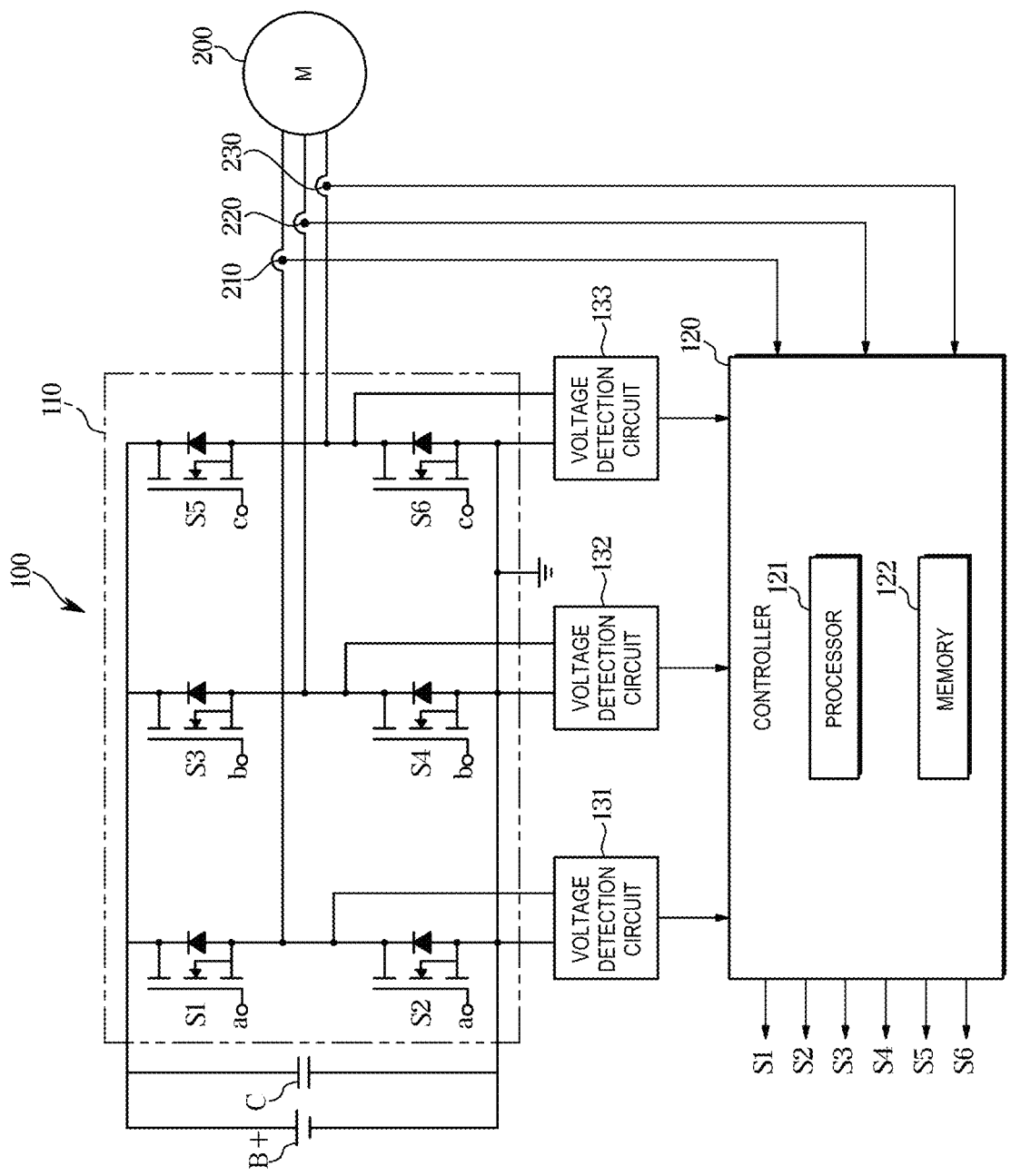
FIG. 1 illustrates a control block of a power conversion device in accordance with one embodiment.

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing operations described is an example; however, the sequence of and/or operations is not limited to that set forth herein and may be changed as is known in the art, with the exception of operations necessarily occurring in a particular order. In addition, respective descriptions of well-known functions and constructions may be omitted for increased clarity and conciseness.

Additionally, exemplary embodiments will now be described more fully hereinafter with reference to the accompanying drawings. The exemplary embodiments may, however, be embodied in many different forms and should not be construed as being limited to the embodiments set forth herein. These embodiments are provided so that this disclosure will be thorough and complete and will fully convey the exemplary embodiments to those of ordinary skill in the art. Like numerals denote like elements throughout.

It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present.

The terminology used herein is for the purpose of describing particular embodiments only and is not intended to be limiting. As used herein, the singular forms "a," "an," and "the," are intended to include the plural forms as well, unless the context clearly indicates otherwise.

The expression, "at least one of a, b, and c," should be understood as including only a, only b, only c, both a and b, both a and c, both b and c, or all of a, b, and c.

Reference will now be made in detail to the exemplary embodiments of the present disclosure, examples of which are illustrated in the accompanying drawings, wherein like reference numerals refer to like elements throughout.

FIG. 1 illustrates a control block of a power conversion device in accordance with one embodiment.

Referring to FIG. 1, a power conversion device 100 is a device that converts direct current (DC) power, which is supplied from a battery B+ as a DC power source, into alternating current (AC) power and drives a motor 200 as a load.

The power conversion device 100 may include an inverter 110, a controller 120, and a voltage detection circuit 130.

Current sensors 210, 220, and 230 configured to detect a phase current of the motor 200 may be installed between the power conversion device 100 and the motor 200.

The inverter 110 may be electrically connected to a DC link capacitor C that smooths a DC voltage supplied from the battery B+. The DC link capacity C may be connected in parallel with the battery B+. The DC voltage smoothed by the DC link capacitor C may be supplied to the inverter 110.

The inverter 110 may convert the DC voltage into a pulse-shaped three-phase AC voltage with an arbitrary variable frequency through pulse width modulation (PWM) and may drive the motor 200. The inverter 110 may include a plurality of power switching elements. For example, the inverter 110 may include six power switching elements S1 to S6.

The power switching elements S1 to S6 may be metal oxide semiconductor field effect transistors (MOSFETs), insulated gate bipolar transistors (IGBTs), bipolar junction transistors (BJTs), and the like. The power switching elements S1 to S6 may be turned on or off by a control signal of the controller 120.

When the power switching elements S1 to S6 are MOSFETs, a source terminal, a drain terminal, and a gate terminal are installed in each of the power switching elements S1 to S6. The present embodiment shows a case in which a MOSFET is used as a power switching element, but when an IGBT is used, a source terminal may be replaced by an emitter terminal, and a drain terminal may be replaced by a collector terminal. Hereinafter, for convenience of description, it is assumed that the power switching elements S1 to S6 are MOSFETs.

Among the six power switching elements S1 to S6, two elements form a pair of leg in series, and each pair is connected to a phase terminal of the motor 200. Upper switching elements S1, S3 and S5 may be connected to a (+) terminal of a DC power source. Lower switching elements S2, S4, and S6 may be connected to a (−) terminal of the DC power source. That is, a first power switching element S1 and a second power switching S2, a third power switching element S3 and a fourth power switching element S4, and a fifth power switching element S5 and a sixth power switching element S6 may be connected in series in order to correspond to phase a, phase b, and phase c, respectively.

The inverter 110 may provide a current supplied from the battery B+ by turning on or off each of the power switching elements S1 to S6 according to a control signal of the controller 120 to the motor 200 by converting a direct current into an alternating current. Herein, a voltage of the battery B+ may be boosted by a converter and provided to the inverter 110.

The controller 120 is electrically connected to the inverter 110, the voltage detection circuits 131, 132, and 133, and the current sensors 210, 220, and 230.

The voltage detection circuits 131, 132, and 133 detect voltages of low-side power switching elements S2, S4, and S6 among the six power switching elements S1 to S6.

The voltage detection circuits 131, 132, and 133 may include a first voltage detection circuit 131, a second voltage detection circuit 132, and a third voltage detection circuit 133. The first voltage detection circuit 131 detects a voltage across the second power switching element S2 among the low-side power switching elements S2, S4, and S6. The second voltage detection circuit 132 detects a voltage across the fourth power switching element S4. The third voltage detection circuit 133 detects a voltage across the sixth power switching element S6.

The current sensors 210, 220, and 230 may include a first current sensor 210, a second current sensor 220, and a third current sensor 230. The first current sensor 210 may detect a current of any one phase of three phases of the motor 200.

The first current sensor 210 may detect a phase current that is output from the inverter 110 to any one phase of three phase of the motor 200. For example, the first current sensor 110 may be provided to detect a current of phase A among phase A, phase B, and phase C. The second current sensor 220 may detect a current of any one phase of the remaining two phases. For example, the second current sensor 220 may be provided to detect a current of phase B between phase B and phase C. The third current sensor 230 may be provided to detect a current of phase C. Only two current sensors may be installed instead of three current sensors, and a phase current of a phase, in which no current sensor is installed, may be estimated using a current balance equation.

The motor 200 is a three-phase motor and may have a stator and a rotor. Each phase terminal of the motor 200 may be connected to the inverter 310.

The motor 200 may include motor coils of an A-phase coil, a B-phase coil, and a C-phase coil. The A-phase coil, the B-phase coil, and the C-phase coil may be provided to have a phase of 120 electrical degrees. The A-phase coil, the B-phase coil, and the C-phase coil may constitute a Y connection.

In the motor 200, an alternating current with a phase difference of 120 degrees provided from the inverter 110 may be energized in each phase coil. Thus, a rotation shaft of the motor 200 may rotate.

For example, each of the current sensors 210, 220, and 230 is connected in series to each phase coil.

Each of the current sensors 210, 220, and 230 may be a CT sensor or a shunt resistor. The CT sensor is a sensor designed to generate a secondary alternating current proportional to a current measured at a primary side using the principle of a transformer. The shunt resistor is a sensor configured to identify a current through a voltage, that is, a potential difference generated across a resistor according to Ohm's law when a very small resistor is inserted into a conducting wire through which current flows.

Each phase current detected by each of the current sensors 210, 220, and 230 is delivered to the controller 120.

The controller 120 may include a processor 121 and a memory 122.

The memory 122 may store a program and/or data for driving the motor 200 through the inverter 110.

The memory 122 may store a program and/or data for estimating a junction temperature of each of the power switching elements of the inverter 110.

The memory 122 may temporarily memorize voltage information received from the voltage detection circuit 130 and temporarily memorize phase current information received from the current sensors 210, 220, and 230.

In addition, the memory 122 stores a function or a lookup table representing a relationship between a parasitic resistance Rdson and a junction temperature Tj of the power switching element.

The memory 122 may include not only a volatile memory such as a S-RAM or a D-RAM but also a non-volatile memory such as a flash memory, a read only memory (ROM), or an erasable programmable read only memory (EPROM).

The processor 121 may be implemented using at least one of application specific integrated circuits (ASICs), digital signal processors (DSPs), digital signal processing devices (DSPs), programmable logic devices (PLDs), field programmable gate arrays (FPGAs), micro-controllers, and microprocessors.

The controller 120 may drive the motor 200 by applying a three-phase voltage to the motor 200 through the inverter 110.

When driving the motor 200, the controller 120 may determine a parasitic resistance of the power switching element based on current information of the current sensors 210, 220, and 230 and voltage information of the voltage detection circuit 130, and detect a junction temperature of the power switching element not in an indirect way but in a direct way by estimating the junction temperature of the power switching element based on the parasitic resistance, thereby detecting the junction temperature more accurately and reliably.

The controller 120 may determine an A-phase driving current, a B-phase driving current, and a C-phase driving current based on parasitic resistance information of the power switching element and voltage information of the voltage detection circuit 130 when driving the motor 200.

The controller 120 may identify failure of the current sensors 210, 220, and 230 based on an output signal of each of the current sensors 210, 220, and 230 and the voltage information of the voltage detection circuit 130 when driving the motor 200. For example, the controller 120 may estimate a driving current value of the motor 200 based on a parasitic resistance value of the power switching element and a voltage value of the voltage detection circuit 130 at room temperature. The controller 120 may compare an estimated current value of the motor 200 and a measured current value of the current sensors 210, 220, and 230 and, and when a difference between the estimated current value and the measured current value is greater than a permissible error, the failure of the current sensors 210, 220, and 230 may be identified.

In case of the failure of the current sensors 210, 220, and 230, the controller 120 may detect a driving current of the motor 200 based on the parasitic resistance information of the power switching element and the voltage information of the voltage detection circuit 130 when driving the motor 200.

Figure 2:
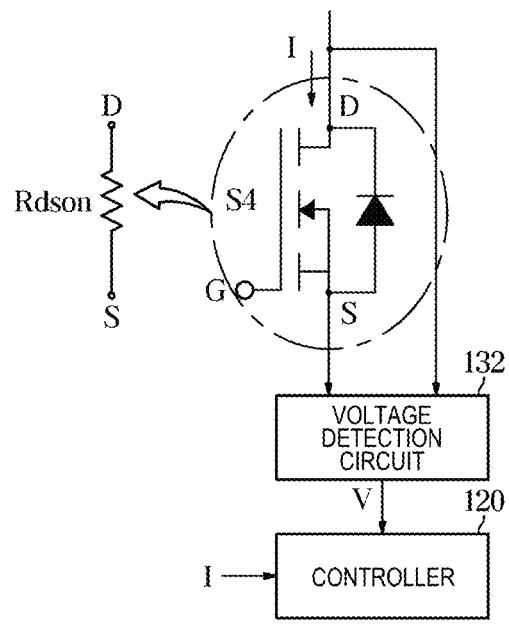
FIG. 2 illustrates detection of a parasitic resistance Rdson of any one power switching element among a plurality of power switching elements of an inverter of FIG. 1.

FIG. 2 illustrates detection of a parasitic resistance Rdson of any one power switching element among a plurality of power switching elements of the inverter of FIG. 1.

Referring to FIG. 2, a parasitic resistance exists in a power switching element constituting an inverter and is referred to as Rdson when the power switching element is an MOSFET.

FIG. 2 shows detecting a parasitic resistance Rdson of the fourth power switching element S4 among the low-side power switching elements S2, S4, and S6 of the inverter 110.

The parasitic resistance Rdson of the fourth power switching element S4 is a drain D-source S resistance value when the fourth power switching element S4 is turned on.

When a power switching element is designed and fabricated through a processing process, resistance components occur in a source and a drain which are not intended. This is referred to as a parasitic resistance. As the parasitic resistance becomes smaller, the element performance is improved.

The parasitic resistance Rdson of the fourth power switching element S4 may be measured using Ohm's law (V=IR). The parasitic resistance Rdson may be detected by applying a turn-on voltage to a gate G of the fourth power switching element S4 and then measuring a voltage drop of the parasitic resistance Rdson caused by a drain current I (phase current) flowing through the drain D.

The current sensors 210, 220, and 230 for detecting a three-phase current and the power switching elements S1 to S6 are needed to construct an inverter. Since a phase current value flowing through the drain terminal D of a corresponding power switching element may be known using the current sensors 210, 220, and 230 and a drain-source voltage value at the corresponding current may be known using the voltage detection circuits 131, 132, and 133, a parasitic resistance value may be known. Herein, I is a current flowing through the fourth power switching element S4 through the current sensors 210, 220, and 230, V is a drain D-source S voltage detected through the voltage detection circuit 132 when I flows through the drain terminal D, and R is a parasitic resistance value according to a junction temperature.

To this end, a voltage across the fourth power switching element S4 should be measured.

The second voltage detection circuit 132 is provided to detect the voltage across the fourth power switching element S4. The second voltage detection circuit 132 is provided to detect the voltage across the drain D-source S voltage of the fourth power switching element S4.

In order to detect the voltage between the drain terminal D and the source terminal S of the fourth power switching element S4, the second voltage detection circuit 132 has one side electrically connected to the drain terminal D of the fourth power switching element S4 and the other side electrically connected to the source terminal S.

Figure 3:
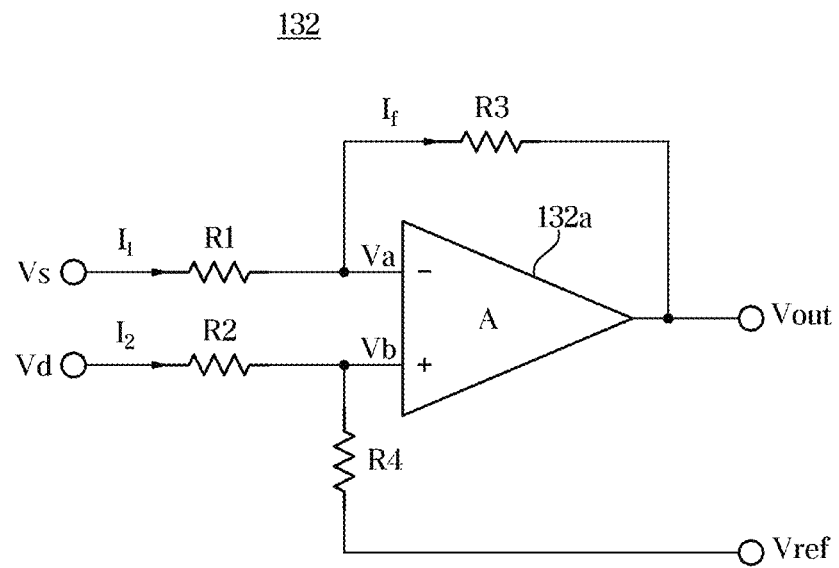
FIG. 3 illustrates a voltage detection circuit of FIG. 2.

FIG. 3 illustrates the voltage detection circuit of FIG. 2.

Referring to FIG. 3, the voltage detection circuit 132 includes a differential amplifier.

The differential amplifier is an amplifier configured to amplify a difference between two input signals.

The voltage detection circuit 132 may include an operational amplifier 132a including a positive (+) input signal, a negative (−) input terminal, and an output terminal as a differential amplifier.

A first resistor R1 is connected between a source voltage Vs, which is a first input voltage, and the negative (−) input terminal.

A second resistor R2 is connected between a drain voltage Vd, which is a second input voltage, and the positive (+) input terminal.

A third resistor R3 is placed between the negative (−) input terminal and the output terminal.

A fourth resistor R4 is placed between the positive (+) input terminal and a reference voltage Vref (or earth).

An input/output transfer function of the differential amplifier may be expressed by applying Kirchhoff's current law (KCL), as shown in Equation 1 below.

$$V_{out} = \left(1 + \frac{R_3}{R_1}\right)\left(\frac{R_4}{R_2 + R_4}\right) \cdot V_d - \frac{R_3}{R_1} V_s \qquad \text{Equation 1}$$

If $R_1=R_2$; $R_3=R_4$, Equation 1 may be expressed as Equation 2 below.

$$V_{out} = \frac{R_3}{R_1}(V_d - V_s) \qquad \text{Equation 2}$$

Accordingly, since the differential amplifier is capable of amplifying a voltage difference between Vd and Vs, a drain-source voltage of a power switching element may be detected.

Figure 4:
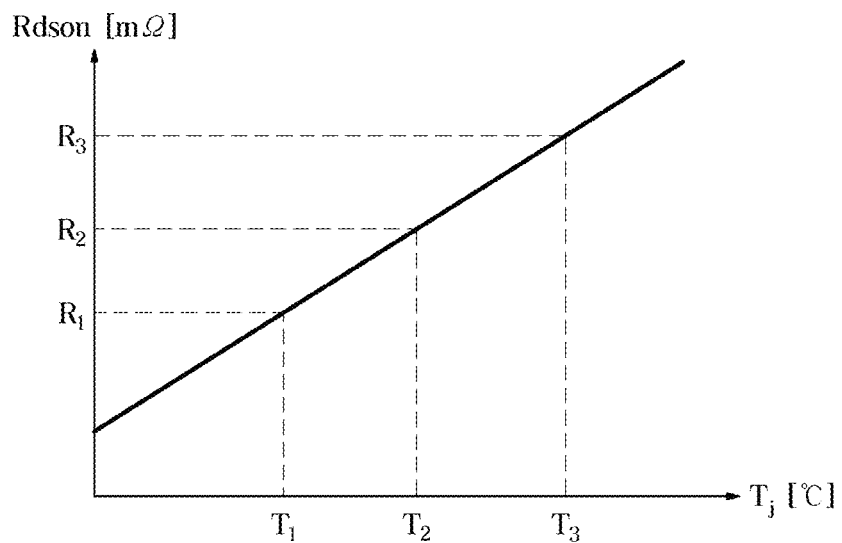
FIG. 4 is a graph showing a relationship between a parasitic resistance Rdson and a junction temperature Tj of the power switching element of FIG. 2.

FIG. 4 is a graph showing a relationship between the parasitic resistance Rdson and the junction temperature Tj of the power switching element of FIG. 2.

Referring to FIG. 4, the graph shows the junction temperature Tj according to each parasitic resistance Rdson.

The vertical axis shows the parasitic resistance Rdson, and the horizontal axis shows the junction temperature Tj.

It can be seen that the higher the parasitic resistance, the higher the junction temperature.

For example, when Rdson increases from 0.5 mΩ to 1.0 mΩ, the junction temperature may rise from 25° C. to 1,000° C.

The junction temperature linearly increases according to the parasitic resistance and may rise along a straight line or an exponential curve.

Since the junction temperatures for each parasitic resistance are stored in the memory 122 of the controller 120 as a lookup table or a function, when a current parasitic resistance value is known, a corresponding current junction temperature value may be known.

Figure 5:
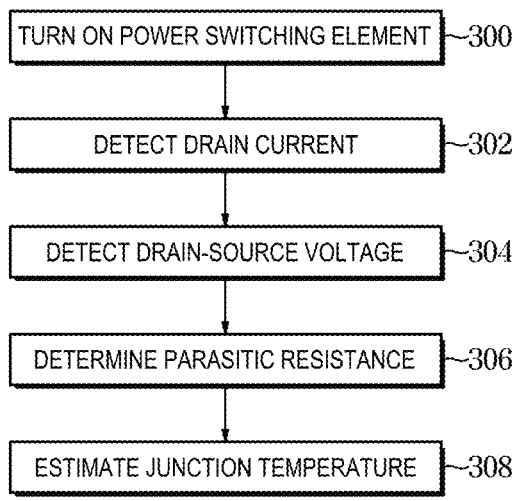
FIG. 5 illustrates a controlling method of the power conversion device in accordance with one embodiment.

FIG. 5 illustrates a controlling method of the power conversion device in accordance with one embodiment.

Referring to FIG. 5, the power conversion device 100 turns on a power switching element to be turned on according to a switching sequence while the motor 200 is driven (300).

The power conversion device 100 detects a drain current flowing through a drain terminal of the turned-on power switching element through any one current sensor of the current sensors 210, 220, and 230 (302).

The power conversion device 100 detects a drain-source voltage of the turned-on power switching element through a voltage detection circuit, which is connected to the turned-on power switching element, among the voltage detection circuits 131, 132, and 133 (304).

The power conversion device 100 determines a parasitic resistance Rdson of the turned-on power switching element based on the drain current and the drain-source voltage of the turned-on power switching element (306).

The power conversion device 100 estimates a current junction temperature Tj corresponding to a current parasitic resistance Rdson using a parasitic resistance-junction temperature lookup table stored in the memory 122 (308).

As described above, the power conversion device according to one embodiment may detect the junction temperature more accurately and reliably by directly detecting the junction temperature through the parasitic resistance of a power switching element of an inverter. Thus, safer and more reliable inverter control may be performed.

Figure 6:
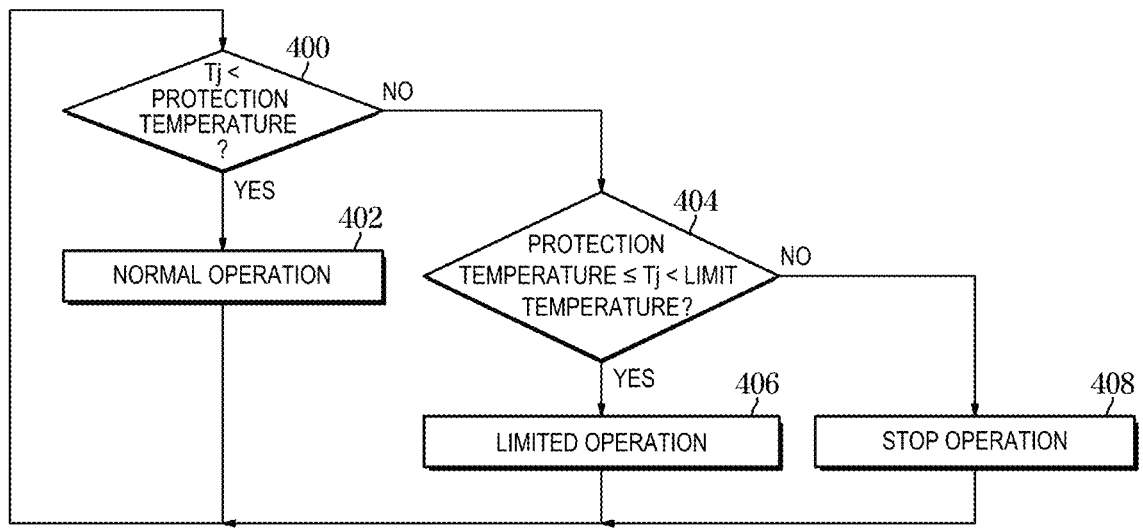
FIG. 6 illustrates a change of a drive mode according to a junction temperature of a power switching element in the power conversion device in accordance with one embodiment.

FIG. 6 illustrates a change of a drive mode according to a junction temperature of the power switching element in the power conversion device in accordance with one embodiment.

Referring to FIG. 6, the power conversion device 100 may change a motor operation based on a highest junction temperature among junction temperatures of the low-side power switching elements S2, S4, and S6.

First, the power conversion device 100 compares a junction temperature Tj and a protection temperature and determines whether or not the junction temperature Tj is less than the protection temperature (400). The protection temperature is a preset temperature and may be set based on a ratio to a limit temperature within a predetermined range of temperatures in which a MOSFET can operate normally. The protection temperature may be stored in the memory 122 in advance.

When the junction temperature Tj is less than the protection temperature, the power conversion device 100 normally operates the inverter 110 without output derating that reduces an output of the inverter 110 (402).

The power conversion device 100 determines whether the junction temperature Tj is equal to or higher than the protection temperature and less than the limit temperature (404).

When the junction temperature Tj is equal to or higher than the protection temperature and less than the limit temperature, the power conversion device 100 limits the inverter 110 to perform output derating that reduces the output of the inverter 110 (406). For example, the junction temperature is prevented from rising since an output current of the inverter 110 is reduced.

When the junction temperature Tj exceeds the limit temperature, the power conversion device 100 stops the operation of the inverter 110 (408).

Figure 7:
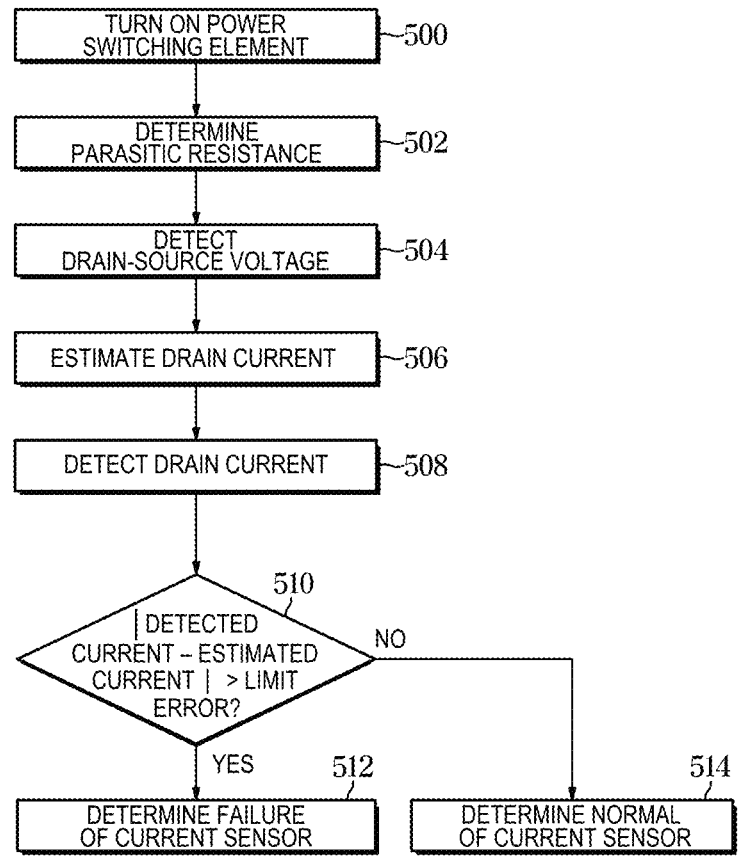
FIG. 7 illustrates that the power conversion device in accordance with one embodiment determines failure of a current sensor.

FIG. 7 illustrates that the power conversion device determines failure of the current sensor in accordance with one embodiment.

Referring to FIG. 7, the power conversion device 100 turns on a power switching element to be turned on according to a switching sequence while the motor 200 is driven (500).

The power conversion device 100 determines a parasitic resistance Rdson of the turned-on power switching element using a parasitic resistance-junction temperature lookup table stored in the memory 122 (502).

The power conversion device 100 detects a drain-source voltage of the turned-on power switching element through a voltage detection circuit, which is connected to the turned-on power switching element, among the voltage detection circuits 131, 132, and 133 (504).

The power conversion device 100 estimates a drain current based on the drain-source voltage of the turned-on power switching element and the parasitic resistance Rdson of the turned-on power switching element (506).

The power conversion device 100 detects a drain current flowing through a drain terminal of the turned-on power switching element through any one current sensor of the current sensors 210, 220, and 230 (508).

The power conversion device 100 determines whether or not a difference (absolute value of difference) between the detected drain current and the estimated drain current is greater than a limit error (510).

When the difference (absolute value of difference) between the detected drain current and the estimated drain current is greater than the limit error (Yes of 510), the power conversion device 100 determines the failure of the current sensors 210, 220, and 230 (512). The power conversion device 100 may determine the drain current, which is estimated based on the drain-source voltage of the turned-on power switching element and the parasitic resistance Rdson of the turned-on power switching element, as a drain current of the turned-on power switching element.

When the difference (absolute value of difference) between the detected drain current and the estimated drain current is not greater than the limit error (No of 510), the power conversion device 100 determines the normal operation of the current sensors 210, 220, and 230 (514). The power conversion device 100 may determine the drain current, which is detected through any one current sensor of the current sensors 210, 220, and 230, as a drain current of the turned-on power switching element.

According to one aspect of the present disclosure, a junction temperature of a power switching element can be detected more accurately and reliably by directly detecting the junction temperature.

According to one aspect of the present disclosure, a driving current can be reliably detected by dualizing a tool for measuring the driving current.

Exemplary embodiments of the present disclosure have been described above. In the exemplary embodiments described above, some components may be implemented as a "module". Here, the term 'module' means, but is not limited to, a software and/or hardware component, such as a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The operations provided for in the components and modules may be combined into fewer components and modules or further separated into additional components and modules. In addition, the components and modules may be implemented such that they execute one or more CPUs in a device.

With that being said, and in addition to the above described exemplary embodiments, embodiments can thus be implemented through computer readable code/instructions in/on a medium, e.g., a computer readable medium, to control at least one processing element to implement any above described exemplary embodiment. The medium can correspond to any medium/media permitting the storing and/or transmission of the computer readable code.

The computer-readable code can be recorded on a medium or transmitted through the Internet. The medium may include Read Only Memory (ROM), Random Access Memory (RAM), Compact Disk-Read Only Memories (CD-ROMs), magnetic tapes, floppy disks, and optical recording medium. Also, the medium may be a non-transitory computer-readable medium. The media may also be a distributed network, so that the computer readable code is stored or transferred and executed in a distributed fashion. Still further, as only an example, the processing element could include at least one processor or at least one computer processor, and processing elements may be distributed and/or included in a single device.

While exemplary embodiments have been described with respect to a limited number of embodiments, those skilled in the art, having the benefit of this disclosure, will appreciate that other embodiments can be devised which do not depart from the scope as disclosed herein. Accordingly, the scope should be limited only by the attached claims.

What is claimed is:

1. A device comprising:
   an inverter including a plurality of power switching elements configured to control a current supplied to a motor;
   a current sensor configured to detect a phase current of each phase of the motor;
   a plurality of voltage detection circuits configured to detect voltages of the plurality of power switching elements; and
   a controller configured to:
   determine a parasitic resistance of a turned-on power switching element among the plurality of power switching elements based on the phase current and a voltage of the turned-on power switching element, and
   determine a junction temperature of the turned-on power switching element based on the parasitic resistance.

2. The device of claim 1, wherein the plurality of voltage detection circuits are provided to be connected to a plurality of low-side power switching elements among the plurality of power switching elements.

3. The device of claim 2, wherein the plurality of low-side power switching elements comprise metal oxide semiconductor field effect transistors (MOSFETs), and
   each of the plurality of voltage detection circuits is provided to detect a voltage between a drain terminal and a source terminal of each of the MOSFETs.

4. The device of claim 1, wherein the controller comprises a memory in which junction temperatures for each parasitic resistance are stored.

5. The device of claim 4, wherein the controller is configured to determine a junction temperature corresponding to the determined parasitic resistance according to the junction temperatures for each parasitic resistance stored in the memory.

6. The device of claim 1, wherein the controller is configured to reduce an output of the inverter based on the junction temperature being higher than a preset temperature.

7. The device of claim 6, wherein the controller is configured to reduce an output current of the inverter according to the junction temperature.

8. A device comprising:
   an inverter including a plurality of power switching elements configured to control a current supplied to a motor;
   a current sensor configured to detect a detected phase current of each phase of the motor;
   a plurality of voltage detection circuits configured to detect voltages of the plurality of power switching elements; and
   a controller configured to:
   determine a determined phase current of a turned-on power switching element among the plurality of power switching elements based on a voltage of the turned-on power switching element and a parasitic resistance of the turned-on power switching element, and
   identify a phase current of the turned-on power switching element based on the detected phase current of the turned-on power switching element and the determined phase current of the turned-on power switching element.

9. The device of claim 8, wherein the plurality of voltage detection circuits are provided to be connected to a plurality of low-side power switching elements among the plurality of power switching elements.

10. The device of claim 9, wherein the plurality of low-side power switching elements comprise metal oxide semiconductor field effect transistors (MOSFETs), and
    each of the plurality of voltage detection circuits is provided to detect a voltage between a drain terminal and a source terminal of each of the MOSFETs.

11. The device of claim 8, wherein the controller comprises a memory in which parasitic resistances of the plurality of power switching elements are stored.

12. The device of claim 11, wherein the controller is configured to determine the determined phase current of the turned-on power switching element based on the voltage of the turned-on power switching element and the parasitic resistance of the turned-on power switching element stored in the memory.

13. The device of claim 8, wherein the controller is configured to determine failure of the current sensor based on a difference between the detected phase current and the determined phase current being greater than a predetermined permissible error.

14. The device of claim 13, wherein the controller is configured to determine the determined phase current as the phase current of the turned-on power switching element.

15. The device of claim 13, wherein the controller is configured to determine a normal operation of the current sensor based on the difference between the detected phase current and the determined phase current not being greater than the predetermined permissible error.

16. A method comprising:
    detecting a current of a power switching element through a current sensor when the power switching element is driven;
    detecting a voltage of the power switching element through a voltage detection circuit connected to both ends of the power switching element;
    determining a parasitic resistance of the power switching element based on the current and the voltage of the power switching element; and
    determining a junction temperature of the power switching element based on the parasitic resistance.

17. The method of claim 16, wherein the determining of the junction temperature comprises determining a junction temperature corresponding to the parasitic resistance using a lookup table in which junction temperatures for each parasitic resistance are recorded.

18. The method of claim 16, further comprising:
    comparing the junction temperature and a preset temperature; and
    reducing an output of the power conversion device based on the junction temperature being higher than the preset temperature.

19. The method of claim 16, further comprising:
    determining a current of the power switching element based on the voltage of the power switching element and the parasitic resistance of the power switching element; and
    determining a phase current of the power switching element based on the detected current of the power switching element and the determined current of the power switching element.

20. The method of claim 19, wherein the determining of the phase current of the power switching element comprises:
    determining failure of the current sensor based on a difference between the detected current and the determined current being greater than a predetermined permissible error; and
    determining the determined current as the phase current of the power switching element in response to the failure of the current sensor.

* * * * *